United States Patent [19]

Schubert et al.

[11] Patent Number: 5,721,162

[45] Date of Patent: Feb. 24, 1998

[54] ALL-SILICON MONOLITHIC MOTION SENSOR WITH INTEGRATED CONDITIONING CIRCUIT

[75] Inventors: Peter James Schubert; Steven Edward Staller, both of Kokomo; Dan Wesley Chilcott, Sharpsville; Mark Billings Kearney, Kokomo, all of Ind.

[73] Assignee: Delco Electronics Corporation, Kokomo, Ind.

[21] Appl. No.: 552,401

[22] Filed: Nov. 3, 1995

[51] Int. Cl.$^6$ ............................................. H01L 21/00
[52] U.S. Cl. ............................ 438/52; 438/739; 438/456
[58] Field of Search .......................... 438/50, 52, 53, 438/739, 455, 456, 700, 712, 977, 719, 740, 459, 510; 73/514.32, 514.36

[56] References Cited

U.S. PATENT DOCUMENTS

| | | | |
|---|---|---|---|
| 5,150,616 | 9/1992 | Kondo et al. | 73/517 R |
| 5,369,057 | 11/1994 | Lee et al. | 437/205 |
| 5,413,955 | 5/1995 | Lee et al. | 437/901 |
| 5,427,975 | 6/1995 | Sparks et al. | 437/79 |
| 5,429,993 | 7/1995 | Beitman | 437/228 |
| 5,576,250 | 11/1996 | Diem et al. | 437/228 |
| 5,614,742 | 3/1997 | Gessner et al. | 73/514.36 |
| 5,629,243 | 5/1997 | Cahill et al. | 438/50 |
| 5,656,512 | 8/1997 | Beitman | 438/52 |
| 5,660,680 | 8/1997 | Keller et al. | 438/50 |

FOREIGN PATENT DOCUMENTS

| | | | |
|---|---|---|---|
| 0 368 446 A | 5/1990 | European Pat. Off. | G01P 15/12 |
| 0 543 430 A | 5/1993 | European Pat. Off. | G01L 9/00 |
| 0 624 900 A | 11/1994 | European Pat. Off. | H01L 21/76 |
| 3134570 | 6/1991 | Japan | G01P 15/125 |

OTHER PUBLICATIONS

Juan et al., "Released 51 Microstructures Fabricated by Deep Etching and Shallow Diffusion," Journal of Microelectromechanical Systems, vol. 5 No. 1, Mar. 1996.

Klassen et al., "Silicon Fusion Bonding and Deep Reactive Ion Etching," Transducers 95, 8th International Conf., Sweden (Jun. 25–29, 1995).

de Boer et al., "The Black Silicon Method V," Transducers 95, 8th International Conf., Stockholm, Sweden (Jun. 25–29, 1995).

Juan et al., "A Novel Etch–Diffusion Process . . . ," Transducers 95, 8th International Conf., Stockholm, Sweden (Jun. 25–29, 1995).

Primary Examiner—John Niebling
Assistant Examiner—S. Mulpuri
Attorney, Agent, or Firm—Jimmy L. Funke

[57] ABSTRACT

A motion sensor including a sensing wafer with a bulk micromachined sensing element, and a capping wafer on which is formed the conditioning circuitry for the sensor. The sensing and capping wafers are configured such that, when bonded together, the capping wafer encloses the sensing element to form a monolithic sensor. The capping wafer is further configured to expose bond pads on the sensing wafer, and to enable singulation of the two-wafer stack into individual dies. Wire bonds can be made to both wafers, such that the sensor can be packaged in essentially any way desired.

30 Claims, 6 Drawing Sheets

ALL-SILICON MONOLITHIC MOTION SENSOR WITH INTEGRATED CONDITIONING CIRCUIT

The present invention generally relates to micromachined semiconductor sensing devices. More particularly, this invention relates to an all-silicon monolithic motion sensor that is integrated with its conditioning circuitry in a manner that reduces the overall size of the sensor while promoting the reliability and performance characteristics of the sensor.

BACKGROUND OF THE INVENTION

There is a continuing emphasis for motion sensors that are lower in cost and smaller in size, yet are characterized by high reliability and a high performance capability. These requirements often conflict, since the design requirements for a sensor's sensing elements and its associated conditioning circuitry do not coincide, and often diverge. Sensors finding wide acceptance on the basis of furthering the above objects include those that utilize a micromachined sensing element.

There are generally two technologies for micromachined motion sensors—a bulk etching technique and a surface thin film technique. In bulk etching, a silicon wafer is selectively etched to produce flexible membranes or beams with one or more internal or external sensing elements. In surface micromachined sensors, thin films of an electrically conductive material, such as polysilicon or metal, are formed over sacrificial layers on a substrate. By selectively removing portions of the sacrificial layers, the films are freed to move in response to an applied force or acceleration. With both forms of micromachined elements, sensing can be achieved through the formation of piezoresistive diffusions within the sensing element, piezoelectric films on the element, or a capacitive or tunneling sense mechanism that is sensitive to the deflection of a conductive surface.

Considerable prior art exists within the motion sensing art, and numerous techniques and structures have been proposed for attaining motion sensors that are lower in cost and smaller in size, while achieving high reliability and performance characteristics. However, as noted above, there is an intense and continuing effort to promote these objects, while further optimizing the design of motion sensors through enhanced up-integration and design flexibility.

SUMMARY OF THE INVENTION

It is an object of this invention to provide an improved method for fabricating an integrated motion sensor in which the sensor's sensing element and its conditioning circuitry are contained within a single monolithic wafer, such that the overall size of the sensor is minimized.

It is another object of this invention that such a method entails a minimal number of processing steps to form a micromachined sensing element.

It is still another object that such a method is conducive to forming various types of sensing elements having a wide variety of physical configurations, with the ability to optimize the size and geometry of a sensing element in order to promote its reliability and performance characteristics.

It is a further object of this invention that the sensor is constructed to protect the sensing element.

In accordance with a preferred embodiment of this invention, these and other objects and advantages are accomplished as follows.

According to the present invention, there is provided a motion sensor having one or more sensing elements formed in the near-surface region of a bulk silicon sensing wafer, and a capping wafer on which is formed the conditioning circuitry for the sensor. The sensing and capping wafers are configured such that, once bonded together, a portion of the capping wafer can be removed to expose bond pads on the sensing wafer, and a second operation can be performed to singulate the two-wafer stack into individual dies. Furthermore, wire bonds can be made to both wafers, such that the sensor can be packaged in essentially any way desired.

The method for achieving the sensor of this invention generally entails the steps of forming a doped region of one electrical conductivity type in a sensing wafer of the opposite electrical conductivity type. A trench is then selectively etched in the doped region so as to form a micromachined motion sensing element therein. A preferred trench etch process utilizes an internal layer of oxide formed within the sensing wafer, such as Silicon-On-Insulator (SOI) techniques. A high aspect ratio silicon etch is employed to selectively form a trench in the wafer so as to expose the oxide beneath. A selective etch of the underlying oxide can then be performed to form the sensing element in a manner that enables the element to move in response to an applied force.

Conditioning circuitry for the sensing wafer is formed in a second, circuit wafer having recesses etched in one of its surfaces. The circuit wafer is then bonded to the sensing wafer such that one of the recesses in the circuit wafer encases the trench and forms an enclosure for the micromachined motion sensing element. A portion of the circuit wafer in which a second recess is formed is then removed so as to expose bond pads on the surface of the sensing wafer, enabling the conditioning circuitry to be interconnected with the sensing element and any senor packaging. Importantly, this second recess enables removal of the portion of the circuit wafer above the bond pads without damaging the bond pads.

From the above, it can be appreciated that the present invention provides a motion sensor characterized by a further level of up-integration and design flexibility than what has been possible in the prior art. Furthermore, the method of this invention yields a relatively low cost micromachined motion sensor capable of achieving high reliability and high performance, while also enabling the integration of a relatively large sensing element within a relatively small sensor package.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which.

DETAILED DESCRIPTION OF THE INVENTION

Figure 1:
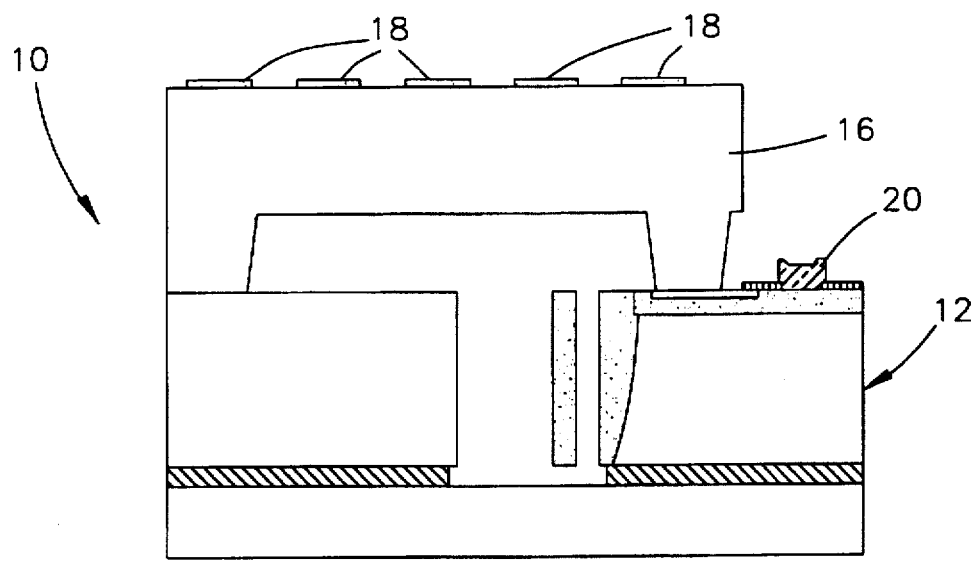
FIG. 1 shows, in cross-section, an all silicon monolithic motion sensor with integrated conditioning circuitry in accordance with a preferred embodiment of this invention.
Figure 2:
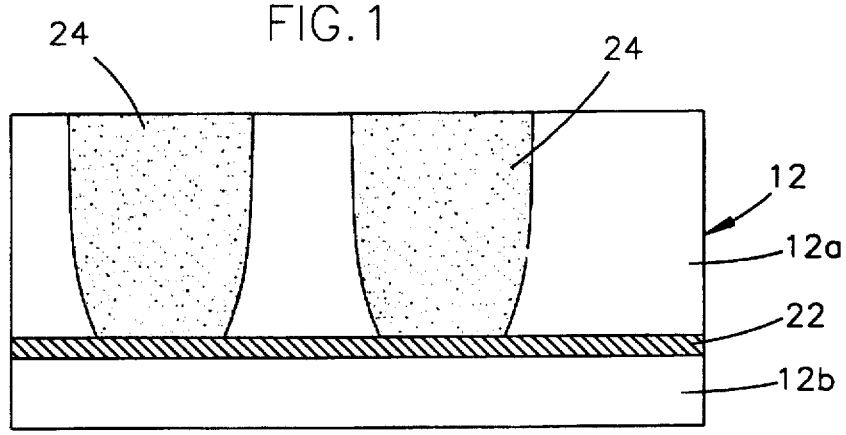
FIGS. 2 through 5 represent processing steps entailed in the fabrication of a sensing chip for the sensor of FIG. 1.

FIG. 1 represents an all-silicon monolithic motion sensor 10 of a type in accordance with the present invention. As illustrated, the sensor 10 includes a sensing wafer 12 incorporating a sensing element 14, and a circuit wafer 16 bonded to the sensing wafer 12 so as to enclose the sensing element 14. In accordance with this invention, conditioning circuitry 18 for the sensing element 14 is formed on the circuit wafer 16. Bond pads 20 present on the sensing wafer 12 enable the conditioning circuitry 18 and the sensing element 14 to be electrically interconnected using such conventional methods as wire bonding.

The above structure yields a motion sensor 10 characterized by a fully-integrated monolithic construction. While conventional silicon processing materials can be employed to form the sensor 10, other materials could be used, including elemental and compound semiconductor materials, or layers of conducting and insulating materials. As those skilled in the art will appreciate, the choice of materials will determine the appropriate processes for forming selective regions of conductivity and resistance in the wafers. In addition, while the polarity of p-type and n-type regions in the wafers are generally interchangeable, each conductivity type incurs tradeoffs that would be appreciated and accommodated by one skilled in the art. Consequently, it is foreseeable that the present invention can be utilized to encompass a multitude of applications through the addition or substitution of other processing or sensing technologies. Also, there may be additional layers of passivation or protection required for manufacturability. Such techniques are known in the art, and therefore will not be discussed.

The relative physical dimensions indicated in the Figures are primarily for illustrated purposes and should not be construed as a restriction to the teachings of the present invention. Essentially, the size of the sensor 10 can vary considerably, with the process encompassed by this invention being most efficient if multiple sensors 10 are simultaneously formed from a wafer stack that is subsequently sawed to separate the individual sensors 10.

Finally, various sensing techniques can be encompassed with this invention with minor variations to the process. Specifically, this invention can be modified to incorporate a diffusion for piezoresistive sensing, an added film deposition for piezoelectric sensing, or the formation of a tunneling tip for a quantum tunneling sensor. For simplicity, the Figures and the following description are restricted to capacitive sensing.

Processing steps for the fabrication and assembly of the sensor 10 of FIG. 1 are generally outlined in FIGS. 2 through 9. With reference to FIGS. 2 through 5, the sensing wafer 12 is shown as being a silicon-on-insulator (SOI) wafer. As known in the art, SOI wafers of this type generally include upper and lower silicon layers 12a and 12b, respectively, separated by an internal layer of oxide 22. As shown, the sensing wafer 12 is lightly doped p-type and selectively diffused to form deep N+ regions 24 within the p-type upper silicon layer 12a. Typical thicknesses for the wafer 12 are about two micrometers for the oxide layer 22 and about twenty micrometers for the top silicon layer 12a, though the thicknesses of these layers could vary significantly.

Figure 3:
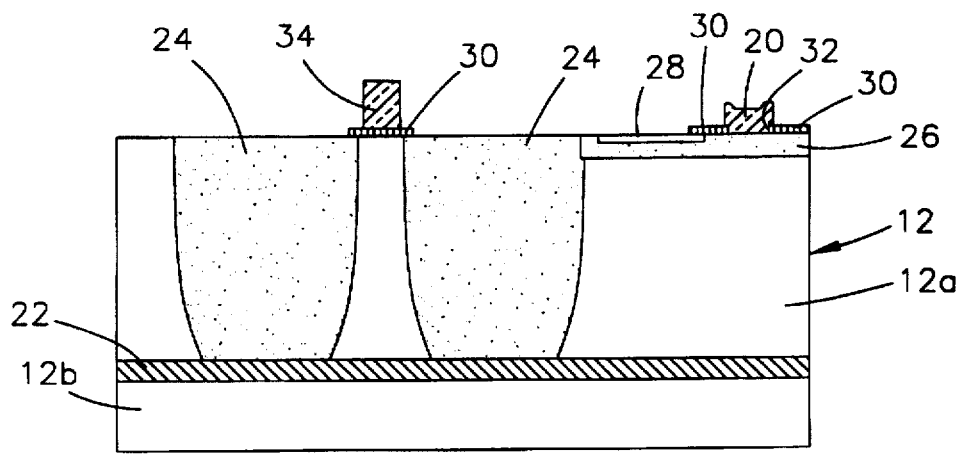

FIG. 3 shows the result of several additional processing steps. One such step is the formation of a shallow N+ conductive region 26 in the surface of the top silicon layer 12a of the wafer 12. A suitable thickness for the N+ conductive region 26 is about three micrometers, which is sufficient to provide a relatively low capacitance connection between the deep N+ regions 24 and the subsequently-formed bond pads 20. Next, a P++ region 28 is formed in the surface of the wafer 12 within the N+ conductive region 26, such that conduction of electricity is effectively buried below the surface of the wafer 12. Though optional, the P++ region 28 is advantageous for its ability to prevent surface leakage paths from shorting between adjacent N+ conductor regions 26 when the circuit chip 16 is subsequently bonded here to the sensing chip 12. Finally, dielectric layers 30 are formed, contact holes 32 are defined, and metallization lines 34, including the bond pads 20, are patterned as shown using standard integrated circuit techniques.

It is worth noting that the N+ conductive region 26 is optional, since the deep N+ regions 24 could be extended to serve the same function. However, the presence of the N+conductive region 26 is useful to minimize stray capacitance, and also allows the creation of a vertical PNP bipolar junction transistor for a buffer circuit on the sensing wafer 12. Such a circuit is useful in reducing the effect on the sensor output signal of the relatively high parasitic capacitances of the wire bonds required between the sensor and circuit wafers 12 and 16. In the formation of the buffer circuit, the N+ conductive region 26 and the P++ region 28 form the base and emitter regions, respectively, of the bipolar junction transistor, while a second P++ region (not shown) formed simultaneously with the P++ region 28 forms the collector region of the transistor. From the above, it is apparent that a suitable buffer circuit can be incorporated onto the sensing wafer 12 without materially altering the process of this invention.

Figure 4:
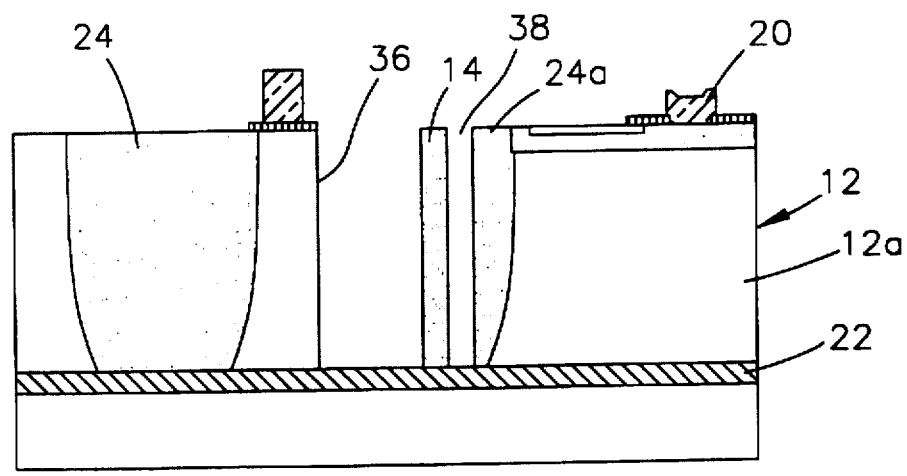

FIG. 4 represents the result of a high aspect ratio anisotropic etch through one of the deep N+ regions 24, by which a trench 36 is formed in the top silicon layer 12a to expose a portion of the oxide layer 22 and to define the sensing element 14. In accordance with known practices, a selective reactive ion etch with high selectivity to a masking material (not shown) is suitable for forming the trench 36, though other techniques known in the art would also be suitable. The sensing element 14 is shown as forming a capacitive structure with an adjacent trench wall 24a of the deep N+ region 24 across a gap 38, though other sensing technologies could be employed as previously noted.

Figure 5:
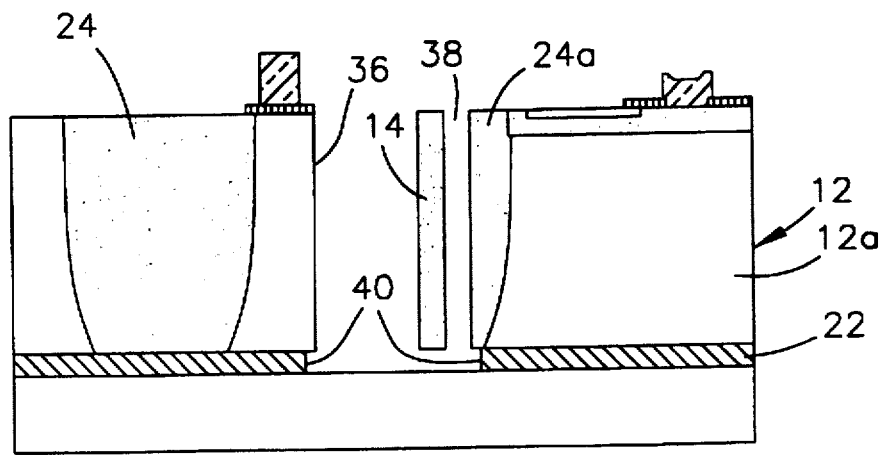

FIG. 5 shows the result of selectively etching the oxide layer 22 exposed at the bottom of the trench 36, such that the sensing element 14 is undercut so as to be rendered cantilevered. A suitable etching technique is to employ a buffered solution of dilute hydrofluoric acid (HF). Using hydrofluoric acid as the etchant, etching for a duration of about twenty-five minutes results in an undercut 40 of about 2.5 micrometers being laterally etched from the perimeter of the trench 36. In doing so, all portions of the sensing element 14 having a width of less than about twice this distance (i.e., about five micrometers) are entirely freed from the oxide layer 22, while portions of the sensing element 14 having a greater width remain anchored to the sensing wafer 12 through the oxide layer 22. This capability is highly desirable for producing isolated structures such as the cantilevered sensing element 14 shown, the flexibility of which is the basis for motion sensing in the embodiment of FIG. 1.

Figure 10:
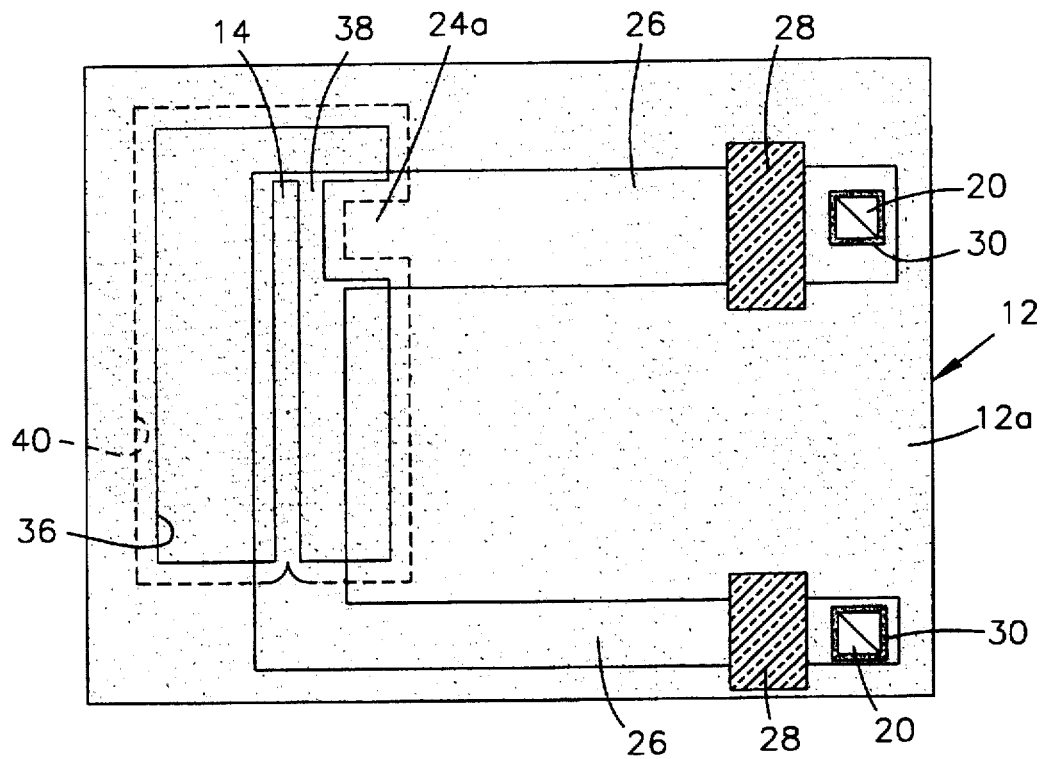
FIG. 10 is a plan view of an alternative sensing chip configuration in accordance with this invention.

FIG. 10 is a plan view of a simplified example of the sensing wafer 12 of FIG. 1, with undercuts 40 through the oxide layer 22 and beneath the upper silicon layer 12a of the sensing wafer 12 being indicated in phantom as an outline of the trench 36. Once its upper surface is treated through appropriate cleaning and preparation, the sensing wafer 12 is ready for bonding to the circuit wafer 16. Preparation of the sensing wafer 12 may entail a plasma treatment, thermal treatment, chemical treatment, or other methods known in the art for enhancing the bond integrity between two silicon wafers.

Figure 6:
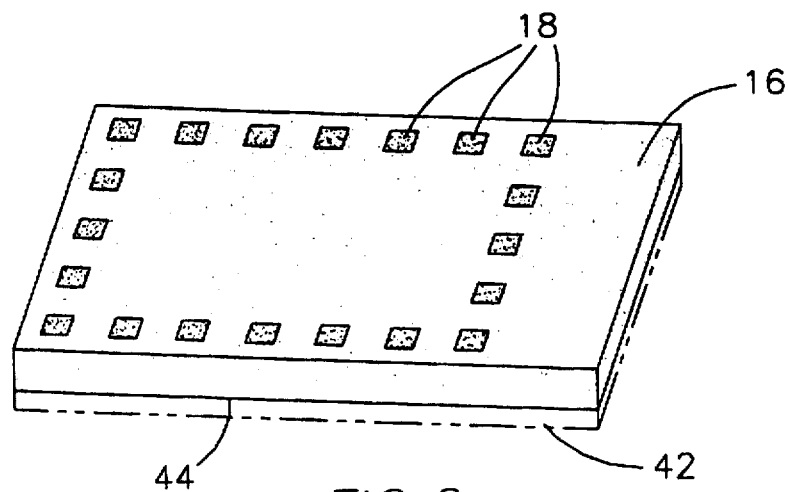
FIGS. 6 and 7 represent processing steps entailed in the fabrication of a circuit chip for the sensor of FIG. 1.
Figure 7:
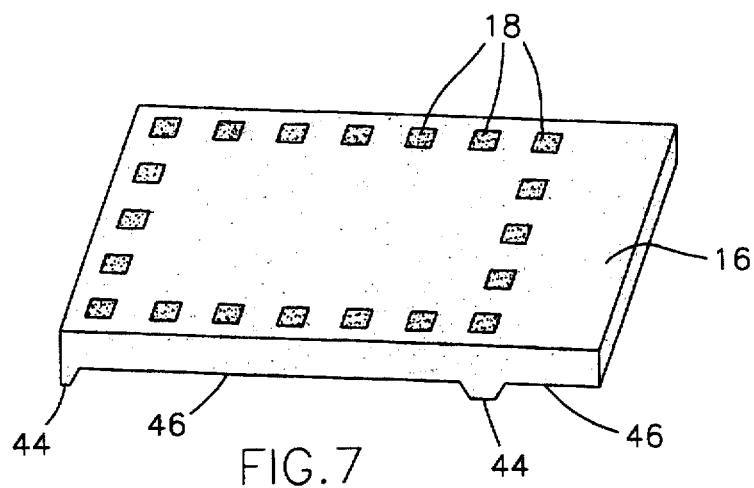

Processing of the circuit wafer 16 is represented in FIGS. 6 and 7, which show the wafer 16 as being a representative die singulated from a larger wafer. As shown in FIG. 6, silicon wafers of the type used to form the circuit wafer 16 typically have rough lower surfaces 42. Because an object of this invention is to bond the circuit wafer 16 to the sensing wafer 12, the method of bonding will determine what processing steps, if any, are necessary for the lower surface 42. A low-temperature silicon fusion bond is discussed below as a highly suitable bonding technique for use in this invention, though other bonding techniques known in the art could be substituted. Generally, low-temperature silicon fusion bonding requires the bonding surface of the circuit wafer 16 to be mirror smooth. The phantom line below the wafer 16 indicates stock removal or thinning of the lower surface 42, followed by polishing to yield a suitable bonding surface 44.

Figure 8:
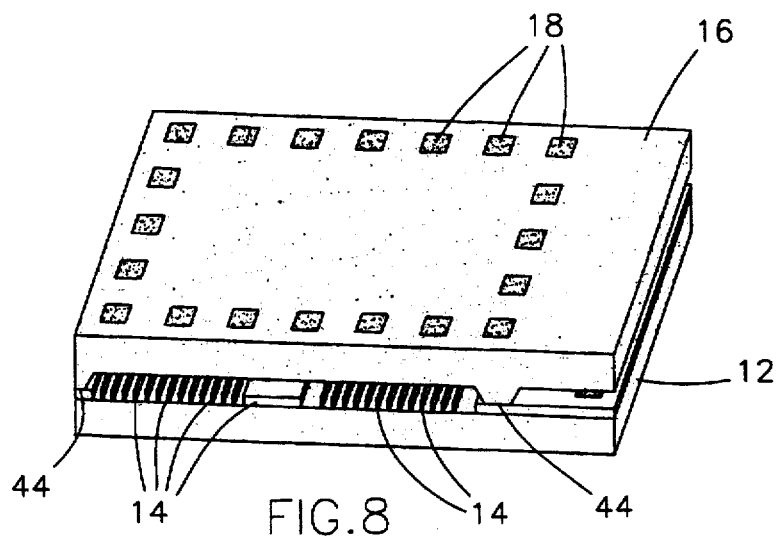
FIGS. 8 and 9 represent final processing steps entailed in the assembly of the sensing and circuit chips to form the sensor of FIG. 1.
Figure 9:
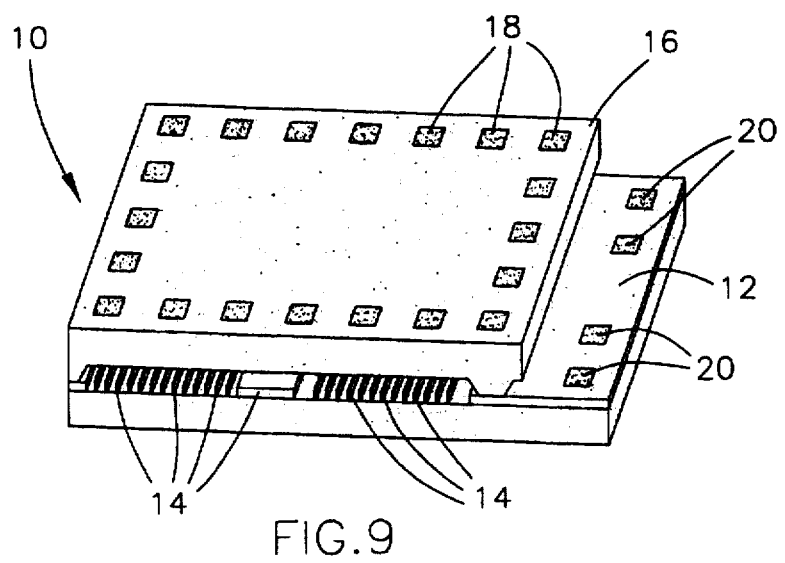

FIG. 7 shows the circuit wafer 16 following the etching of recesses 46 into the bonding surface 44. The recesses 46 serve several important functions. First, they provide relief from the bonding surface 44 so that the sensing element 14 will not come into contact and bond to the circuit wafer 16. Second, the recesses 46 reduce parasitic capacitances between the wafers 12 and 16. Third, one of the recesses 46 forms a clearance over the bond pads 20 on the sensing wafer 12, as shown in FIGS. 8 and 9. The presence of this clearance is important so that a portion of the circuit wafer 16 can be removed without damaging the bond pads 20 on the sensing wafer 12.

Finally, FIGS. 8 and 9 represent the steps for assembling and bonding the circuit wafer 16 to the sensing wafer 12. As was described above, a low-temperature silicon bond is described here. After appropriate smoothing of the bonding surface 44 of the circuit wafer 16 and the mating surfaces of the sensing wafer 12, the wafers 12 and 16 are aligned, pressed together and annealed at around 400° C. to form a permanent bond. It is foreseeable that an alternate bonding method may be preferred for a variety of reasons. Alternative bonding techniques include the use of an adhesive layer printed on the bonding surface 44 of the circuit wafer 16, and the use of a eutectic bond formed through the use of appropriate metals patterned on either wafer 12 or 16. Additionally, ion-bearing insulators could be deposited to effect an anodic bond, or a silicon-to-oxide bonding or oxide-oxide bonding technique could be performed. When using any of these alternative bonding techniques, those skilled in the art will appreciate that the configurations of the P++ layer 28, the N+ layers 24 and 26, and the dielectric layers 30 of the sensing wafer 12 must be optimized together.

FIG. 9 shows the sensor 10 as including a number of sensing elements 14, and with a portion of the circuit wafer 16 being removed to expose the bond pads 20 of the sensing wafer 12. A wide saw blade is preferably used to remove only a portion of the circuit wafer 16 over the sensor wafer bond pad region. A preferred saw blade (not shown) is a very wide resin-type blade having a width of perhaps one millimeter, though it is foreseeable that other saw types and differing saw widths could be used. As is apparent, the depth of the cut must be carefully controlled to prevent damage to the bond pads 20 on the sensing wafer 12. It may be preferable or necessary to form a protective layer (not shown) over the bond pads 20 to prevent damage during this operation. Such a layer would need to survive the wafer bonding process and be capable of being selectively removed prior to wire bonding.

If multiple sensors 10 are simultaneously formed with the same two-wafer stack, a second-pass saw operation would be employed to singulate the wafer stack into individual dies. Wire bonds are then made to both levels, and the sensor 10 can be packaged in any appropriate manner.

From the above description, it can be appreciated that the present invention provides a motion sensor 10 characterized by a further level of up-integration and design flexibility than what has been possible in the prior art. Specifically, the stacked configuration of the sensor 10 significantly minimizes the overall footprint of the sensor 10 while enabling the integration of a relatively large sensing element 14 (as depicted in FIGS. 1 and 10) or a number of smaller sensing elements 14 (as depicted in FIG. 9). As such, the sensor 10 achieves high reliability and a high performance capability, yet can be processed in a manner that yields a relatively low cost micromachined motion sensor.

An advantageous feature capable of being further incorporated into the sensor design of this invention is a buried interconnect for electrically interconnecting various sensor structures of the sensor 10. While not necessary for all applications, a buried interconnect is essential for such applications as the motion sensor 110 shown in FIG. 15. Though almost any type of motion sensor, such as acceleration, resonance and yaw sensors, can be fabricated without a buried interconnect, the addition of a buried interconnect makes possible a wider class of sensor devices that can achieve improved performance and smaller size, and also allows for multiple sensors of various types on a single die. In accordance with this invention, a buried interconnect can be fabricated using a wafer that has been pre-processed to form selective SOI regions. The following description presents two techniques by which selective SOI regions may be formed in a wafer to yield a buried interconnect.

Figure 11:
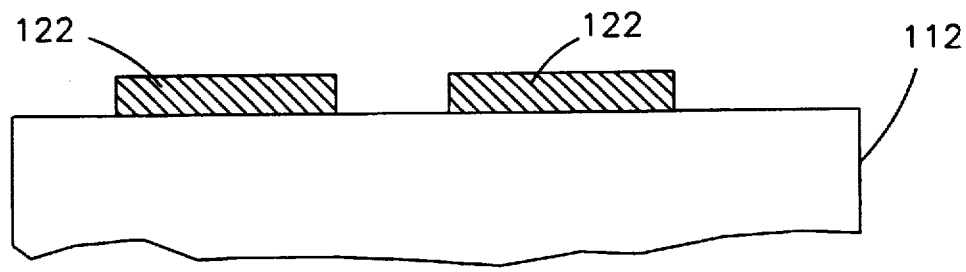
FIGS. 11 through 14 represent alternative processing steps entailed in the fabrication of a sensing chip with a buried interconnect in accordance with this invention.

FIG. 11 represents a silicon wafer 112 in whose surface phosphorus-rich oxide regions 122 have been formed and patterned in a known manner. As with the embodiment of FIGS. 1 through 10, the wafer 112 shown in FIG. 11 will eventually yield a sensing wafer that, with a circuit wafer such as that shown in FIG. 7, will form a two-wafer stack. Also similar to the sensing wafer 12 of FIGS. 1 through 10, the wafer 112 and its processing will be discussed with reference to the wafer 112 being lightly doped p-type, though those skilled in the art will appreciate that a lightly doped n-type wafer could be used if appropriate processing changes are made to the steps discussed below.

Figure 12:
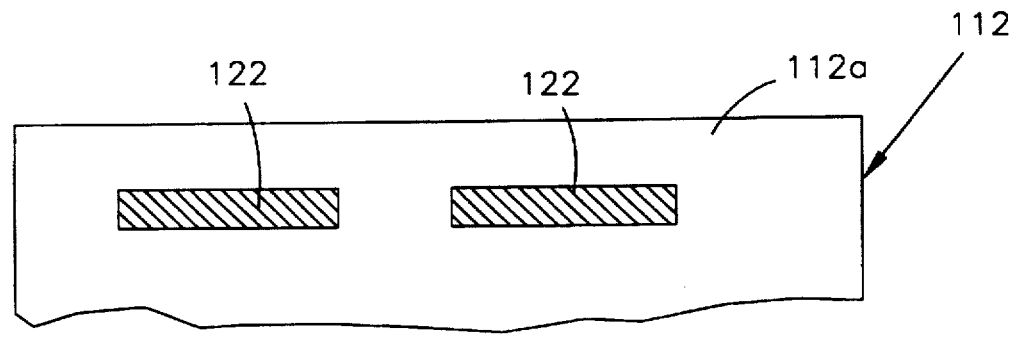

FIG. 12 illustrates the result of forming a single crystal silicon layer 112a over the oxide regions 122 in the wafer 112, such that the oxide regions 122 are buried. One method for achieving this result is to use a merged epitaxial lateral overgrowth technique in which epitaxy is selectively grown from the exposed surface of the silicon wafer 112 until the epitaxy overgrows and merges above the oxide regions 122. Growth of the epitaxy may be continued until the surface of the resulting silicon layer 112a is planar; alternatively, the surface of the epitaxy may be polished back to a mirror surface after the epitaxy has merged above the oxide regions 122. While merged epitaxial lateral overgrowth techniques are known, such techniques have not been widely used for want of a suitable application.

As with the sensing wafer 12 of FIGS. 1 through 10, deep N+ regions 124 are selectively diffused into the p-type silicon layer 112a, which causes the phosphorus within the oxide regions 122 to diffuse outwards in all directions due to the high diffusion temperature required to form the deep N+regions 124. Because phosphorus is an n-type dopant, the diffusion process results in the presence of a halo 148 of n-type silicon around each of the oxide regions 122, with each halo 148 connecting with one of the deep N+ regions 124 to form a continuous, buried conductive layer.

Figure 13:
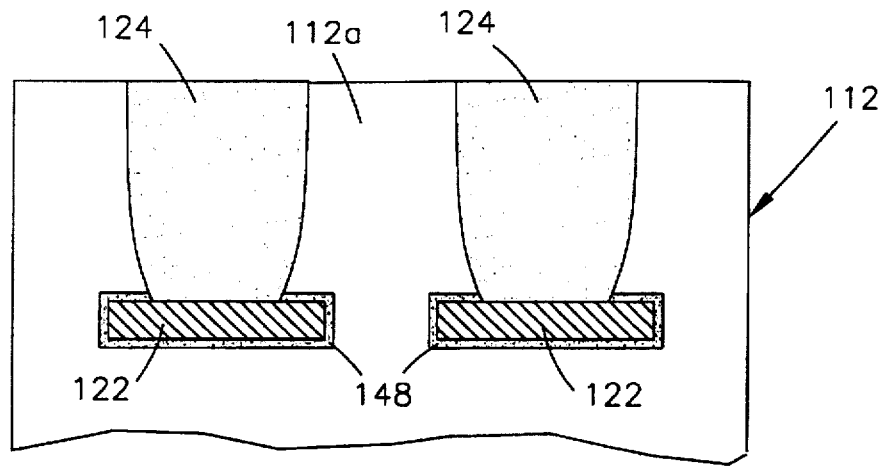
Figure 14:
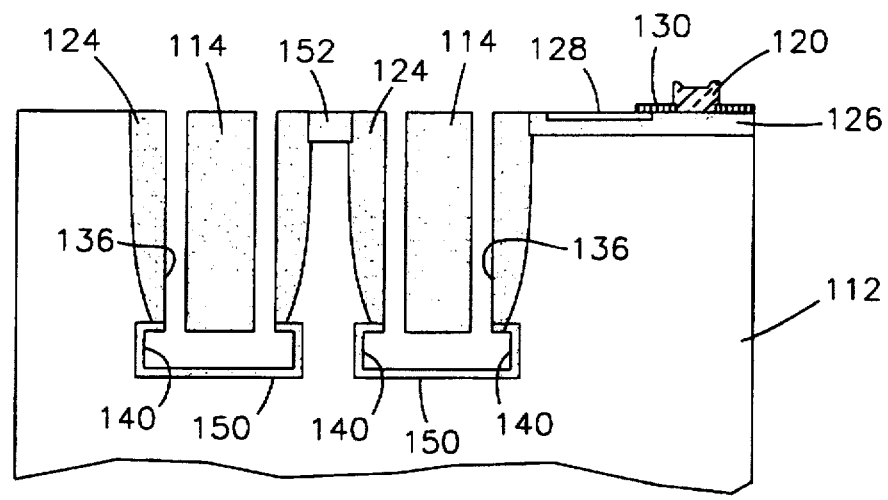

FIG. 14 shows how the diffused regions 124 and 148 of FIG. 13 may be used with the trench and oxide etching steps described previously to form a buried interconnect. In the example of FIG. 14, the trench etching step forms trenches 136 that delineate a cantilevered or suspended sensing element 114 in each deep N+ region 124 and removes a portion of each n-type halo 148, leaving the remainder of each halo 148 to form a buried interconnect 150. Subsequently, the oxide etching step forms undercuts 140 beneath each of the deep N+ regions 124, thereby freeing the sensing elements 114. As a result, each deep N+ regions 124 and the buried interconnect 150 form a path through which electricity can pass beneath the corresponding sensing element 114 to contact an electrode 152 on the other side of the sensing element 114. This capability can be advantageously employed in a variety of sensor designs, including the ring gyroscope design illustrated in FIG. 15.

An additional advantage of this buried interconnect technique is that the oxide etching step will proceed much more rapidly owing to the phosphorus content of the oxide region 122. This allows wider structures to be undercut than with undoped oxide, such as the oxide layer 22 of FIGS. 1 through 5. Another advantage is the selective forming of the oxide regions 122, such that there is no intervening layer of oxide within the monolithic silicon stack. This aspect promotes the performance of the sensor 110 when subjected to temperature excursions. If desired, the trench etch can be extended beyond the oxide region 122 in order to interrupt the buried interconnect 150 if desired.

In addition to the above advantages, a desirable aspect of the above-described process is that it can be performed using a single mask step, though it is also possible to obtain the same buried interconnect 150 using two masking steps. With the latter approach, a phosphorus-doped region would be formed in the silicon wafer 112, and an oxide layer then formed above it, but underlapping the edges of the phosphorus-doped region. The process of forming the deep N+regions 124 would result in the N+ regions 124 being connected with the buried oxide layer and the phosphorus-doped region, forming a buried interconnect 150 beneath the buried oxide layer. Following an oxide etch, the resulting structure would generally appear similar to that shown in FIG. 14, though the faster oxide etch made possible by the preferred process would not occur.

Figure 16:
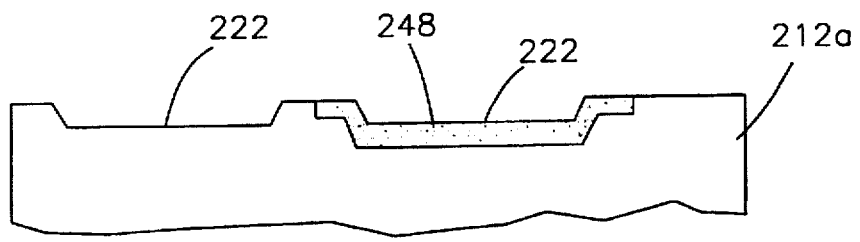
FIGS. 16 through 19 represent alternative processing steps entailed in the fabrication of a sensing chip with a buried interconnect in accordance with this invention.
Figure 17:
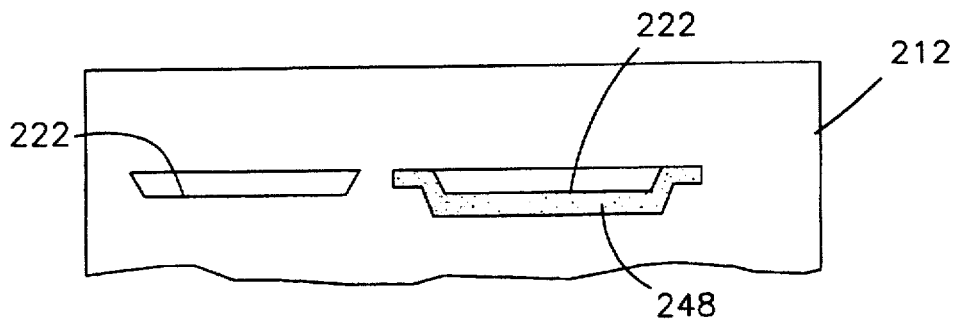

Yet another technique for forming a buried interconnect is to use a buried cavity instead of the buried oxide region 122 of FIGS. 11 through 13. This approach is illustrated in FIG. 16 through 19, and involves etching a wafer 212a to form one or more recesses 222 in its surface. A selective diffusion is then performed, as indicated in Figure 16, to form a doped region 248 that will eventually form a buried interconnect 250 shown in FIGS. 18 and 19. As before, the wafer 212a may be lightly doped p-type and the doped region 248 doped n-type, or vice versa. Thereafter, the wafer 212a is bonded directly to a second wafer to form a monolithic sensing wafer 212 in which the recesses 222 and the doped region 248 are buried. FIG. 17 represents the monolithic sensing wafer 212 after undergoing thinning to achieve a desired thickness for the silicon layer above the recesses 222. Thinning can be accomplished by various techniques known in the art, such as chemical or mechanical polishing, the use of highly-doped boron or boron-plus-germanium etch stop layers, the use of an electrochemical etch-stop, or the use of an SOI wafer that undergoes a selective silicon etch followed by oxide removal.

Figure 18:
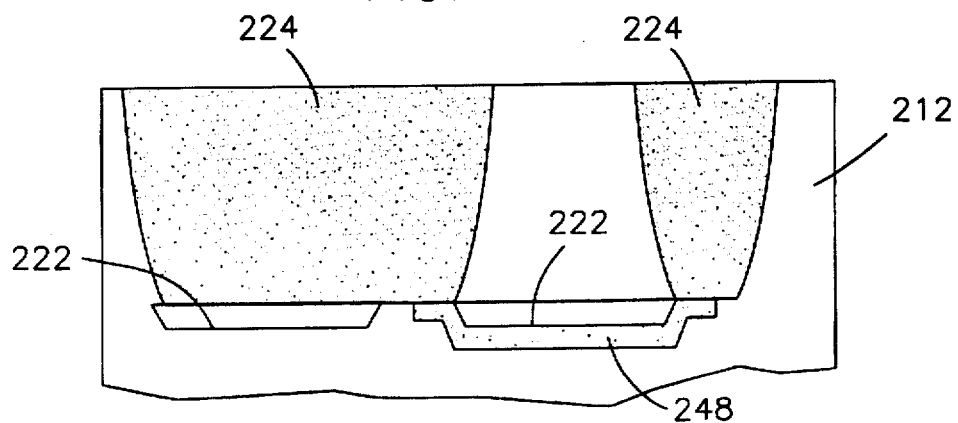
Figure 19:
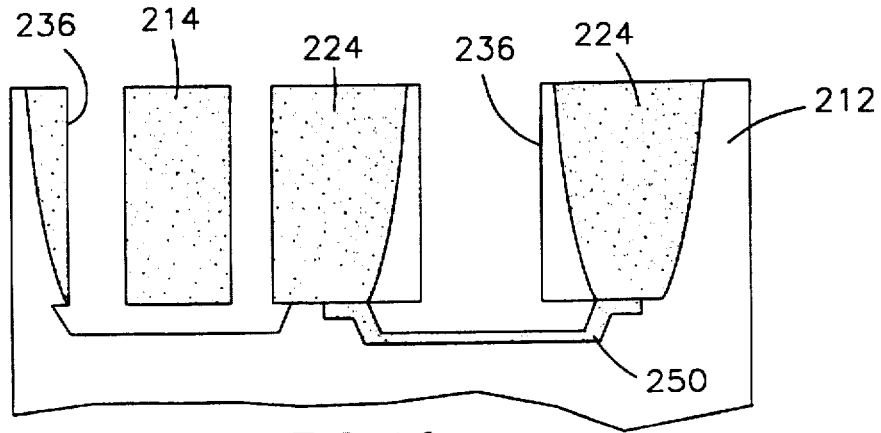

The surface of the wafer 212 is then subjected to a deep N+ diffusion as described for the previous embodiments of this invention, with the result being deep N+ regions 224 shown in FIG. 18. FIG. 19 shows how the deep N+ regions 224 and the doped region 248 of FIG. 18 are combined with a trench etching step of the type described previously to form a buried interconnect 250 having the same basic structure as that of FIG. 14. As before, the trench etching step also serves to form trenches 236, one of which is shown as delineating a cantilevered or suspended sensing element 214 in one of deep N+ region 124.

A significant advantage to the process depicted in FIGS. 16 through 19 is that an oxide etch is not required. As a result, the tendency for a wet undercut etch to result in adhesion of the sensing element to the surrounding silicon structure, a phenomenon known as "stiction," is avoided. An additional advantage is that greater clearances below the sensing element 214 can be achieved to reduce parasitic capacitances. Finally, the interconnect 250 of this process is more readily formable and potentially more repeatable because the interconnect 250 does not rely on an oxide region or layer in order to be appropriately doped.

Figure 15:
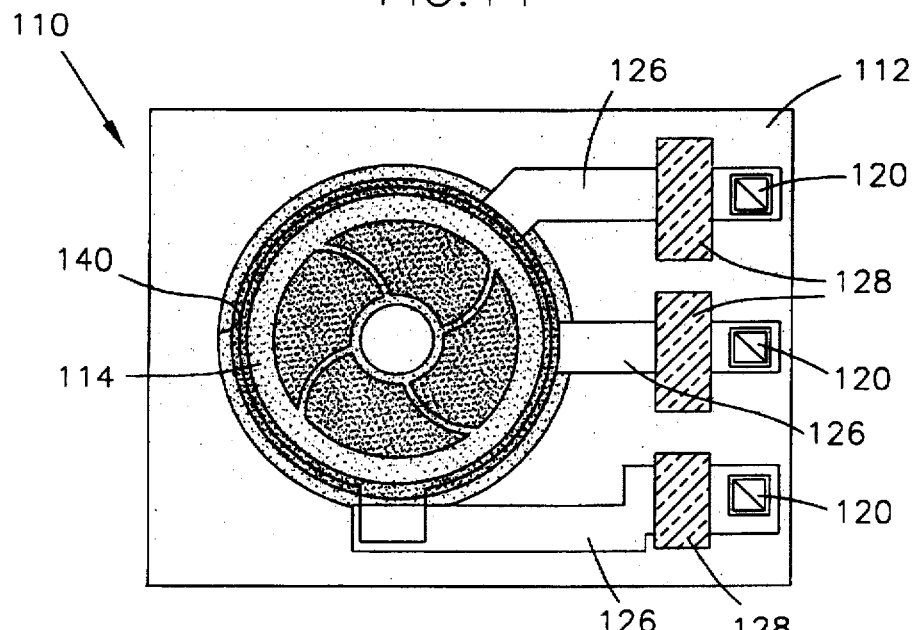
FIG. 15 is a plan view of a sensing chip configuration incorporating the sensing chip of FIGS. 11 through 14.

Those skilled in the art will appreciate that the techniques represented by FIGS. 11 through 19 can be incorporated separately or together to form motion sensors of the types shown in FIGS. 1, 10 and 15, as well as numerous other sensors. With each of the embodiments of this invention, the trenches 36, 136 and 236 containing the sensing elements 14, 114 and 214 are each enclosed with a circuit wafer of the type shown in FIGS. 1 and 9 to form a sealed cavity, as depicted in FIG. 1. The cavities can be sealed at room pressures, or at any level of vacuum desired. The recess 46 in the circuit wafer 16 also allows for a venting port (not shown) to the sensing element. Alternatively or in addition, the trench etching step can be extended to the edge of the sensing wafer 12, 112 and 212 to provide a port, or to provide electrical isolation between elements of the sensor structure. As such, resonant structures can be formed that can be sensitive to specific frequencies or air pressure.

From the above, it can be seen that motion sensors configured in accordance with this invention offer significant advantages. Because of the two-stack wafer construction of this invention, sensing elements do not consume circuit area, yielding a more compact sensor design. The single crystal silicon design further provides the advantages of a high Q value (a dimensionless parameter reflecting energy stored to energy lost in each cycle of an oscillation of a resonating structure), and avoids exposure to fatigue cycling arising from a mismatch in coefficients of thermal expansion. In addition, the two-stack wafer construction yields a sensor that is fully sealed during dicing and packaging, and subsequently when operating within its operating environment, so as to shield the sensing element from foreign material that might otherwise compromise the reliability of the sensor by interfering with the motion of the sensing element or by providing an unwanted electrical path. Finally, it is possible to seal the sensor cavity at any vacuum level, or vent the cavity if so desired.

Though a two-stack wafer construction is employed, the final profile of a sensor in accordance with this invention is equivalent to a single chip design due to thinning of the circuit wafer, which also advantageously retains the benefits of backside (extrinsic) gettering. In addition, no additional capping wafers are required to passivate the sensing wafer. Finally, because wafer bonding is the last step of the fabrication process, wafer yields are not compounded—an error occurring and discovered during processing of either the sensing or circuit wafer does not result in scrappage of the entire sensor.

Additional advantages of this invention are attributable to the micromachining process employed to form the sensing element. Because a bulk micromachining technique is used, very high aspect ratios for the micromachined features and structures are possible. Consequently, sensing elements of this invention are generally characterized by much higher signal levels as compared to surface micromachined structures. Furthermore, the two-stack wafer construction of this invention enables the sensing element to be generously large for greater sensitivity, and further enables the sensing element to be capable of sensing motion along two orthogonal axes. Moreover, the bulk micromachining process of this invention could be combined with surface micromachining processes to achieve further integration.

Accordingly, those skilled in the art will appreciate that the present invention encompasses advantages associated with both bulk and surface micromachining processes. Using novel techniques in an integrated manner, an entire sensing system is fabricated within a single monolithic structure. By including multiple sensing elements, as depicted in FIGS. 8 and 9, three axes of sensing can be achieved. Alternatively, motion sensors such as the gyroscope sensor shown in FIG. 15 can be fabricated by employing the buried interconnect fabrication technique described in reference to FIGS. 11 through 19. Regardless of the sensor type, a sensor configured according to this invention can withstand very high stresses and temperatures due to its monolithic, sealed construction, resulting in heightened reliability. Finally, the design flexibility afforded by this invention makes possible the independent optimization of the sensing element and its circuitry, rendering a technology whose processing costs are less than either bulk or surface micromachining.

While our invention has been described in terms of a preferred embodiment, other forms could be adopted by one skilled in the art. For example, materials or processing techniques other than those described could be employed. Accordingly, the scope of our invention is to be limited only by the following claims.

The embodiments of the invention in which an exclusive property or privilege is claimed are defined as follows:

1. A method for forming a monolithic motion sensor, the method comprising the steps of:

providing a first semiconductor wafer characterized by a first electrical conductivity type;

forming a doped region of a second electrical conductivity type in a surface of the first semiconductor wafer;

selectively etching a trench in the doped region so as to form a micromachined motion sensing element therein;

forming conditioning circuitry for the micromachined motion sensing element on a second semiconductor wafer;

etching a recess in a surface of the second semiconductor wafer;

bonding the second semiconductor wafer to the first semiconductor wafer such that the recess encases the trench and forms an enclosure for the micromachined motion sensing element, and such that a portion of the second semiconductor wafer is disposed above bond pads on the surface of the first semiconductor wafer; and removing the portion of the second semiconductor wafer so as to expose the bond pads on the surface of the first semiconductor wafer.

2. A method as recited in claim 1 wherein the first semiconductor wafer is formed to include an oxide region located below a surface of the first semiconductor wafer, and wherein the step of forming the doped region in the first semiconductor wafer results in the doped region extending to the oxide region, the method further comprising the step of selectively etching the oxide region so as to undercut and free the micromachined motion sensing element.

3. A method as recited in claim 2 wherein the first semiconductor wafer is a bulk silicon wafer and the oxide region is an internal oxide layer of the bulk silicon wafer.

4. A method as recited in claim 2 wherein the first semiconductor wafer comprises an epitaxial layer grown on a bulk silicon wafer, and wherein the oxide region is formed on the bulk silicon wafer and buried by the epitaxial layer.

5. A method as recited in claim 4 wherein the oxide region includes a dopant of the second electrical conductivity type, the dopant diffusing into the first semiconductor wafer during the step of forming the doped region so as to yield a buried interconnect beneath the micromachined motion sensing element.

6. A method as recited in claim 1 wherein the step of selectively etching the trench yields a plurality of micromachined motion sensing elements.

7. A method as recited in claim 1 wherein the micromachined motion sensing element is a cantilevered beam.

8. A method as recited in claim 1 wherein the micromachined motion sensing element forms a capacitive element with a portion of the doped region.

9. A method as recited in claim 1 wherein the first semiconductor wafer is composed of upper and lower wafers of the first electrical conductivity type, the first semiconductor wafer being formed by the steps of:

providing a recess in a surface of the lower wafer;

doping a wall of the recess to have a second electrical conductivity type;

bonding the upper wafer to the lower wafer such that the recess is encased by the upper wafer and the upper and lower wafers form a monolithic wafer;

wherein the doped region is formed in the upper wafer to extend through the upper wafer to the wall of the recess such that the wall forms a buried interconnect, and wherein the trench is selectively etched in the doped region and through the upper wafer to the recess.

10. A method as recited in claim 1 further comprising the step of forming a bipolar junction transistor on the first semiconductor wafer so as to reduce the effects of parasitic capacitances between the first and second semiconductor wafers.

11. A method as recited in claim 1 wherein the step of etching a recess in the surface of the second semiconductor wafer yields a bonding surface between two recesses, a first of the two recesses encasing the trench and a second of the two recesses forming the portion of the second semiconductor above the bond pads, the bonding surface being bonded to the first semiconductor wafer during the bonding step.

12. A method for forming a monolithic motion sensor, the method comprising the steps of:
providing an oxide region located below a surface of a first semiconductor wafer characterized by a first electrical conductivity type;
forming a doped region of a second electrical conductivity type in the first semiconductor wafer, the doped region extending from the surface to the oxide region;
selectively etching a trench in the doped region, the trench extending from the surface to the oxide region so as to yield a structural feature within the trench, such that the structural feature is formed by a portion of the doped region and is contiguous with the oxide region;
selectively etching the oxide region so as to free the structural feature and thereby yield a micromachined motion sensing element;
forming conditioning circuitry for the micromachined motion sensing element on a second semiconductor wafer;
etching a recess in a surface of the second semiconductor wafer;
bonding the second semiconductor wafer to the first semiconductor wafer such that the recess encases the trench and forms an enclosure for the micromachined motion sensing element, and such that a portion of the second semiconductor wafer is disposed above bond pads on the surface of the first semiconductor wafer; and
removing the portion of the second semiconductor wafer so as to expose the bond pads on the surface of the first semiconductor wafer.

13. A method as recited in claim 12 wherein the first semiconductor wafer is a bulk silicon wafer and the oxide region is an internal oxide layer of the bulk silicon wafer.

14. A method as recited in claim 12 wherein the step of selectively etching the trench yields a plurality of structural features within the trench and contiguous with the oxide region, and wherein the step of selectively etching the oxide region frees each of the plurality of structural features so as to yield a plurality of micromachined motion sensing elements.

15. A method as recited in claim 12 wherein the micromachined motion sensing element is a cantilevered beam.

16. A method as recited in claim 12 wherein the micromachined motion sensing element forms a capacitive element with a second portion of the doped region.

17. A method as recited in claim 12 wherein the first semiconductor wafer comprises an epitaxial layer grown on a bulk silicon wafer, and wherein the oxide region is formed on the bulk silicon wafer and buried by the epitaxial layer.

18. A method as recited in claim 17 wherein the oxide region includes a dopant of the second electrical conductivity type, and wherein the dopant diffuses into the first semiconductor wafer during the step of forming the doped region in the first semiconductor wafer so as to yield a buried interconnect beneath the micromachined motion sensing element.

19. A method as recited in claim 12 wherein the first semiconductor wafer is composed of upper and lower wafers of the first electrical conductivity type, the first semiconductor wafer being formed by the steps of:
providing a recess in a surface of the lower wafer;
doping a wall of the recess to be of the second electrical conductivity type;
bonding the upper wafer to the lower wafer such that the recess is encased by the upper wafer and the upper and lower wafers form a monolithic wafer;
wherein the doped region is formed in the upper wafer to extend through the upper wafer to the wall of the recess such that the wall forms a buried interconnect, and wherein the trench is selectively etched in the doped region and through the upper wafer to the recess.

20. A method as recited in claim 12 wherein the step of etching a recess in the surface of the second semiconductor wafer yields a bonding surface between two recesses, the bonding surface being bonded to the first semiconductor wafer during the bonding step.

21. A method as recited in claim 20 further comprising the step of forming a bipolar junction transistor on the first semiconductor wafer so as to reduce the effects of parasitic capacitances between the first and second semiconductor wafers.

22. A method as recited in claim 21 wherein the bipolar junction transistor is disposed beneath the bonding surface of the second semiconductor wafer following the bonding step.

23. A method as recited in claim 21 wherein the bipolar junction transistor is formed by the steps of:
forming a base region of the second electrical conductivity type in the first semiconductor wafer, the base region forming a conductive region between the bond pads and the doped region in the first semiconductor wafer;
forming an emitter region of the first electrical conductivity type in the base region; and
forming a collector region of the second electrical conductivity type in the first semiconductor wafer adjacent the base region.

24. A method for forming a monolithic motion sensor, the method comprising the steps of:
providing a recess in a surface of a first semiconductor wafer characterized by a first electrical conductivity type;
doping a wall of the recess to have a second electrical conductivity type;
bonding a second semiconductor wafer to the first semiconductor wafer such that the recess is encased by the second semiconductor wafer and the first and second semiconductor wafers form a monolithic sensing wafer;
forming a doped region of the second electrical conductivity type in the second semiconductor wafer, the doped region extending through the second semiconductor wafer to the wall of the recess such that the wall forms a buried interconnect;
selectively etching a trench in the doped region, the trench extending through the second semiconductor wafer to the recess so as to yield a micromachined motion sensing element within the trench and above the buried interconnect;
forming conditioning circuitry for the micromachined motion sensing element on a third semiconductor wafer;
etching a recess in a surface of the third semiconductor wafer;

bonding the third semiconductor wafer to the monolithic sensing wafer such that the recess encases the trench and forms an enclosure for the micromachined motion sensing element, and such that a portion of the third semiconductor wafer is disposed above bond pads on the surface of the monolithic sensing wafer; and removing the portion of the third semiconductor wafer so as to expose the bond pads on the surface of the monolithic sensing wafer.

25. A method as recited in claim 24 wherein the micromachined motion sensing element is a cantilevered beam.

26. A method as recited in claim 24 wherein the micromachined motion sensing element forms a capacitive element with a second portion of the doped region.

27. A method as recited in claim 24 wherein the step of etching a recess in the surface of the third semiconductor wafer yields a bonding surface between two recesses, the bonding surface being bonded to the monolithic sensing wafer during the bonding step.

28. A method as recited in claim 27 further comprising the step of forming a bipolar junction transistor on the monolithic sensing wafer so as to reduce the effects of parasitic capacitances between the third semiconductor wafer and the monolithic sensing wafer.

29. A method as recited in claim 28 wherein the bipolar junction transistor is disposed beneath the bonding surface of the third semiconductor wafer following the bonding step.

30. A method as recited in claim 28 wherein the bipolar junction transistor is formed by the steps of:

forming a base region of the second electrical conductivity type in the second semiconductor wafer, the base region forming a conductive region between the bond pads and the doped region in the second semiconductor wafer;

forming an emitter region of the first electrical conductivity type in the base region; and forming a collector region of the second electrical conductivity type in the second semiconductor wafer adjacent the base region.

* * * * *